(12) United States Patent
Wyse

(10) Patent No.: US 7,795,966 B2
(45) Date of Patent: Sep. 14, 2010

(54) BALANCED AMPLIFIER WITH PROTECTION CIRCUIT

(75) Inventor: Russell Wyse, Center Pt., IA (US)

(73) Assignee: Skyworks Solutions, Inc., Woburn, MA (US)

( * ) Notice: Subject to any disclaimer, the term of this patent is extended or adjusted under 35 U.S.C. 154(b) by 104 days.

(21) Appl. No.: 12/217,094

(22) Filed: Jul. 1, 2008

(65) Prior Publication Data

US 2009/0015323 A1   Jan. 15, 2009

Related U.S. Application Data

(60) Provisional application No. 60/959,152, filed on Jul. 10, 2007.

(51) Int. Cl.
*H03F 3/68* (2006.01)

(52) U.S. Cl. .................. 330/124 R; 330/207 P; 330/295

(58) Field of Classification Search ............. 330/124 R, 330/207 P, 295, 286, 53–54
See application file for complete search history.

(56) References Cited

U.S. PATENT DOCUMENTS

| | | | |
|---|---|---|---|
| 4,965,527 A | 10/1990 | Clark et al. | |
| 6,297,696 B1 * | 10/2001 | Abdollahian et al. | 330/124 R |
| 6,496,061 B1 | 12/2002 | Bloom et al. | |
| 6,515,541 B2 | 2/2003 | Cheng et al. | |
| 6,734,726 B2 | 5/2004 | Billsberry et al. | |
| 2004/0095190 A1 | 5/2004 | Klaren et al. | |

* cited by examiner

*Primary Examiner*—Robert Pascal
*Assistant Examiner*—Hieu P Nguyen
(74) *Attorney, Agent, or Firm*—Smith Frohwein Tempel Greenlee Blaha LLC; Michael J. Tempel

(57) ABSTRACT

According to an exemplary embodiment, a balanced amplifier includes an in-phase amplifier coupled to a first input port of an output coupler and a quadrature amplifier coupled to a second input port of the output coupler. The balanced amplifier further includes an impedance termination coupled to an isolated port of the output coupler. The balanced amplifier further includes a protection circuit coupled to the isolated port of the output coupler and configured to limit an amount of power applied across the impedance termination. The balanced amplifier further includes an input coupler having a first output port coupled to an input of the in-phase amplifier and a second output port coupled to an input of the quadrature amplifier.

18 Claims, 4 Drawing Sheets

BALANCED AMPLIFIER WITH PROTECTION CIRCUIT

The present application claims the benefit of and priority to a pending provisional patent application entitled "Balanced Amplifier Isolated Port Protection Circuitry," Ser. No. 60/959,152 filed on Jul. 10, 2007. The disclosure in that pending provisional application is hereby incorporated fully by reference into the present application.

BACKGROUND OF THE INVENTION

1. Field of the Invention

The present invention relates to the field of electrical circuits. More particularly, the invention relates to amplifier circuits.

2. Background Art

Balanced amplifiers, such as balanced power amplifiers, which can be utilized in mobile communications devices, such as cell phones, as well as other types of electronic devices, can provide several advantages compared to single-ended amplifiers. Balanced amplifiers can provide, for example, improved input and output return loss, increased output power, improved third order intercept performance, and improved operational redundancy.

A balanced amplifier typically includes an isolated port termination resistor, which can absorb reflected power caused by an impedance mismatch between the output impedance of the balanced amplifier and the input impedance of a load, such as an antenna. However, if the reflected power becomes too large due to the mismatch between amplifier output impedance and load impedance, the isolated port termination resistor can be damaged or destroyed by a correspondingly large amount of power being dissipated in the termination resistor.

In a conventional approach, a large-size termination resistor can be coupled between the isolated port of the balanced amplifier and ground to prevent damage from high reflected power levels caused by a large mismatch between output impedance of the balanced amplifier and load impedance. However, a large-size termination resistor is undesirable for small-size balanced amplifiers, such as small-size balanced amplifiers typically utilized in cell phones as well as other mobile communications devices.

SUMMARY OF THE INVENTION

A balanced amplifier with protection circuit, substantially as shown in and/or described in connection with at least one of the figures, as set forth more completely in the claims.

DETAILED DESCRIPTION OF THE INVENTION

The present invention is directed to a balanced amplifier with protection circuit. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
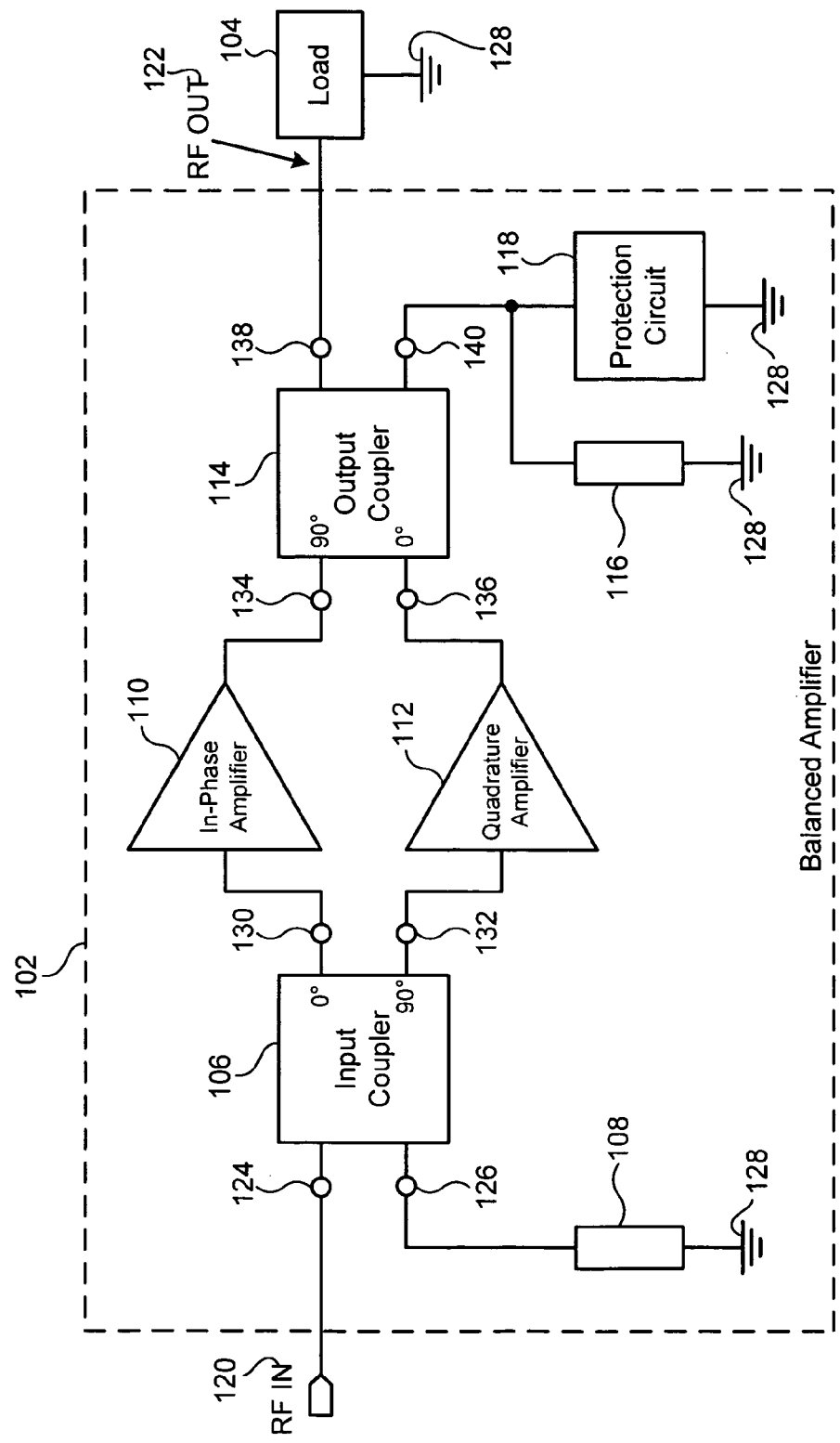
FIG. 1 is a block diagram of an exemplary balanced amplifier with isolated port protection circuit in accordance with one embodiment of the present invention.

FIG. 1 shows a block diagram of an exemplary balanced amplifier coupled to a load in accordance with one embodiment of the present invention. Certain details and features have been left out of FIG. 1, which are apparent to a person of ordinary skill in the art. Balanced amplifier 102, which is coupled to load 104, includes input coupler 106, isolated port impedance termination 108 (also referred to simply as "impedance termination 108"), in-phase amplifier 110, quadrature amplifier 112, output coupler 114, isolated port impedance termination 116 (also referred to simply as "impedance termination 116"), and isolated port protection circuit 118 (also referred to simply as "protection circuit 118").

Balanced amplifier 102, which can be a balanced power amplifier, can be configured to receive a radio frequency (RF) input signal (RF IN) 120 at input port 124 of input coupler 106, amplifier RF IN 120, and generate RF output signal (RF OUT) 122 at output port 138 of output coupler 114, which is coupled to load 104. Balanced amplifier 102 can be fabricated on a single semiconductor die. However, balanced amplifier 102 may also be fabricated on more than one semiconductor die. Balanced amplifier 102 can be utilized in a mobile communications device, such as a cell phone, as well as other types of electronic devices. It is noted that a diplexer, a switch, or other type of device or devices may be inserted between balanced amplifier 102 and load 104 but are not shown in FIG. 1 so as not to obscure the invention.

As shown in FIG. 1, RF IN 120 is coupled to input port 124 of input coupler 106 and a first terminal of impedance termination 108 is coupled to isolated port 126 of input coupler 106 and a second terminal of impedance termination 108 is coupled to ground 128. Impedance termination 108 can comprise a resistor and can have an impedance value that can be determined by the characteristic impedance of a system in which balanced amplifier 102 is utilized. For example, impedance termination 108 can have an impedance value substantially equal to 50.0 ohms. However, the impedance value of impedance termination 108 can also be less than or greater than 50.0 ohms. Impedance termination 108 is required to dissipate only a small amount of power, since it has only a low amplitude RF signal flowing through it. As a result, impedance termination 108 can comprise a small-size resistor, i.e., a resistor having a low wattage rating. In one embodiment, a low impedance RF voltage can be utilized in place of ground 128.

Also shown in FIG. 1, output ports 130 and 132 of input coupler 106 are coupled to respective inputs of in-phase amplifier 110 and quadrature amplifier 112. Input coupler 106 can comprise a quadrature coupler, such as a branchline quadrature coupler or a Lange quadrature coupler. Input coupler 106 can be configured to receive RF IN 120 at input port 124, divide RF IN 120 into an in-phase RF signal, i.e., an RF signal that is substantially in phase with RF IN 120, and a quadrature RF signal, i.e., an RF signal having a phase that is substantially 90.0 degrees out of phase with RF IN 120, and provide the in-phase RF signal at output port 130 and the quadrature RF signal at output port 132.

Further shown in FIG. 1, the output of in-phase amplifier 110 is coupled to input port 134 of output coupler 114 and the output of quadrature amplifier 112 is coupled to input port 136 of output coupler 114. In-phase amplifier 110 can be a power amplifier and can be configured to receive an in-phase RF signal, amplify the in-phase RF signal, and output an amplified in-phase RF signal, which is coupled to input port 134 of output coupler 114. Quadrature amplifier 112 can be a power amplifier and can be configured to receive a quadrature RF signal, amplify the quadrature RF signal, and output an amplified quadrature RF signal, which is coupled to input port 136 of output coupler 114. In-phase amplifier 110 and quadrature amplifier 112 can be matched amplifiers. In-phase amplifier 110 and quadrature amplifier 112 can each have, for example, a substantially equal gain.

Also shown in FIG. 1, output port 138 of output coupler 114 is coupled to a first terminal of load 104, a second terminal of load 104 is coupled to ground 128, isolated port 140 of output coupler 114 is coupled to first terminals of impedance termination 116 and protection circuit 118, and second terminals of impedance termination 116 and protection circuit 118 are coupled to ground 128. Output coupler 114 can comprise a quadrature coupler, such as a branchline quadrature coupler or a Lange quadrature coupler. Output coupler 114 can be configured to receive an amplified in-phase RF signal from in-phase amplifier 110 at input port 134 and an amplified quadrature RF signal from quadrature amplifier 112 at input port 136, combine the amplified in-phase and quadrature RF signals into an amplified RF output signal (i.e. RF OUT 122) that is in phase with RF IN 120 and provide RF OUT 122 at output port 138.

Impedance termination 116 can comprise, for example, a resistor and can have an impedance value that is substantially equal to the impedance value of impedance termination 108. Protection circuit 118 can comprise a voltage clamp and can be configured to clamp the RF voltage at isolated port 140 of output coupler to a predetermined level in both positive and negative half cycles of the RF voltage. By limiting the magnitude of the RF voltage at isolated port 140, protection circuit 118 also limits the magnitude of the RF voltage across impedance termination 116. By limiting the RF voltage across impedance termination 116, the maximum amount of power dissipated by impedance termination 116 can be limited to a level that would not damage or destroy it (i.e. impedance termination 116). As a result, protection circuit 118 can enable a small-size resistor (i.e. a resistor having a low wattage rating) to be utilized for impedance termination 116 while protecting the resistor from an RF voltage level at isolated port 140 that would otherwise damage or destroy it (i.e. the resistor). Load 104 can be, for example, an antenna, such as a cell phone antenna. In another embodiment, load 104 can be a transmission line such as a coaxial cable or a cable comprising one or more pairs of twisted wires.

During the operation of balanced amplifier 102, RF OUT 122 is provided at output port 138 of output coupler 114 and coupled to load 104, which can be an antenna. To transfer a maximum amount of power from balanced amplifier 100 to load 104, which is desirable, the input impedance of load 104 is typically designed to match the output impedance of balanced amplifier 102, which is determined by impedance termination 108. Thus, load 104 can be designed to have an input impedance of, for example, 50.0 ohms so as to match a 50.0 ohm impedance provided by impedance termination 108. However, under adverse operating conditions, the input impedance provided by load 104 can change significantly, thereby causing a very large impedance mismatch between impedance termination 108 and load 104. In a cell phone, for example, the impedance of the cell phone's antenna can significantly change as a result of inadvertent contact with a metal object or a cell phone user's hand, thereby causing a large impedance mismatch between the antenna and a balanced amplifier coupled to the antenna.

As a result of a large impedance mismatch, an adverse voltage standing wave ratio (VSWR) condition can be created between balanced amplifier 102 and load 104, thereby significantly increasing the RF voltage that is reflected from load 104 and applied to impedance termination 116 at isolated port 140 of output coupler 114. However, protection circuit 118, which is coupled between isolated port 140 and ground 128, can clamp the RF voltage at isolated port 140 to a predetermined level, which can be selected so as to prevent damage to impedance termination 116 as a result of a large impedance mismatch that may occur between balanced amplifier 102 and load 104. Protection circuit 118 is further discussed below in relation to FIGS. 2 and 3.

Figure 2:
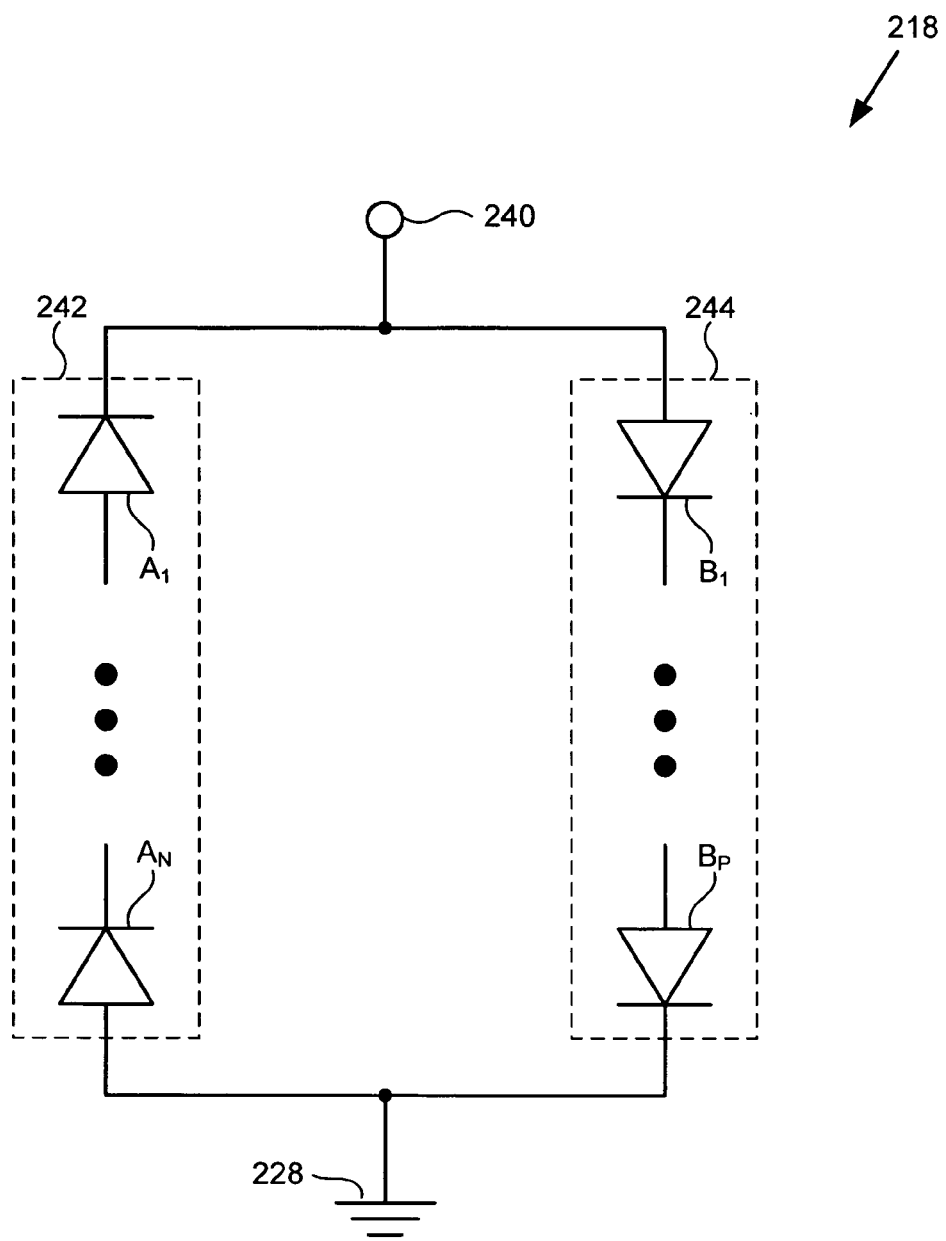
FIG. 2 illustrates a circuit diagram of an exemplary isolated port protection circuit in accordance with one embodiment of the present invention.

FIG. 2 shows a circuit diagram of an exemplary protection circuit for a balanced amplifier in accordance with one embodiment of the present invention. In FIG. 2, protection circuit 218, ground 228, and isolated port 240 correspond, respectively, to protection circuit 118, ground 128, and isolated port 140 in FIG. 1. Protection circuit 218 includes negative voltage clamp 242 and positive voltage clamp 244, which are coupled in a parallel configuration between isolated port 240 and ground 228. Negative voltage clamp 242 includes diodes $A_1, \ldots, A_N$ (hereinafter "diodes $A_1$ through $A_N$") and positive voltage clamp 244 includes diodes $B_1, \ldots, B_P$ (hereinafter "diodes $B_1$ through $B_P$").

As shown in FIG. 2, diodes $A_1$ through $A_N$ are coupled together in series between isolated port 240 and ground 228, where "N" represents the number of series-coupled diodes in negative voltage clamp 242. Diodes $A_1$ through $A_N$ are coupled in series such that the cathode of the first series-coupled diode (i.e. diode $A_1$) is coupled to isolated port 240 and the anode of the last series-coupled diode (i.e. diode $A_N$) is coupled to ground 228. Each of diodes $A_1$ through $A_N$ can be, for example, a fast-switching RF diode. The number of series-coupled diodes in negative voltage clamp 242 can be selected to set a desired "clamping level" at isolated port 240. The "clamping level" refers to a voltage level that if met or exceeded will cause negative voltage clamp 242 to activate and clamp the voltage at isolated port 240. In other words, when the voltage at isolated port 240 drops below a certain value, all diodes $A_1$ through $A_N$ will become forward-biased (i.e. "turned on"), thereby shunting power to ground 228. Since negative voltage clamp 242 clamps the amplitude of the negative cycle of the RF voltage at isolated port 240, the clamping level of negative voltage clamp 242 has a negative voltage value.

As also shown in FIG. 2, diodes $B_1$ through $B_P$ are coupled together in series between isolated port 240 and ground 228, where "P" represents the number of series-coupled diodes in positive voltage clamp 244. Diodes $B_1$ through $B_P$ are coupled in series such that the anode of the first series-coupled diode (i.e. diode $B_1$) is coupled to isolated port 240 and the cathode of the last series-coupled diode (i.e. diode $B_N$) is coupled to ground 228. Each of diodes $B_1$ through $B_P$ can be a fast-switching RF diode. Similar to aforementioned negative voltage clamp 242, the number of series-coupled diodes $B_1$ through $B_P$ can be selected to set the clamping level of positive voltage clamp 244. When the voltage at isolated port 240 rises above a certain value, all diodes $B_1$ through $B_P$ will become forward-biased (i.e. "turned on"), thereby shunting power to ground 228. Since positive voltage clamp 244 clamps the amplitude of the positive cycle of the RF voltage at isolated port 240, the clamping level of positive voltage clamp 244 has a positive voltage value. The number of diodes in negative voltage clamp 242 can be the same as the number of diodes in positive voltage clamp 244.

Thus, by using series-coupled diodes $A_1$ through $A_N$ and series-coupled diodes $B_1$ through $B_P$ to clamp the respective voltage levels of the respective negative and positive cycles of the RF voltage at isolated port 240, protection circuit 218 can effectively protect impedance termination 116 in balanced amplifier 102 from damage during an occurrence of a large impedance mismatch between load 104 and the balanced amplifier.

Figure 3:
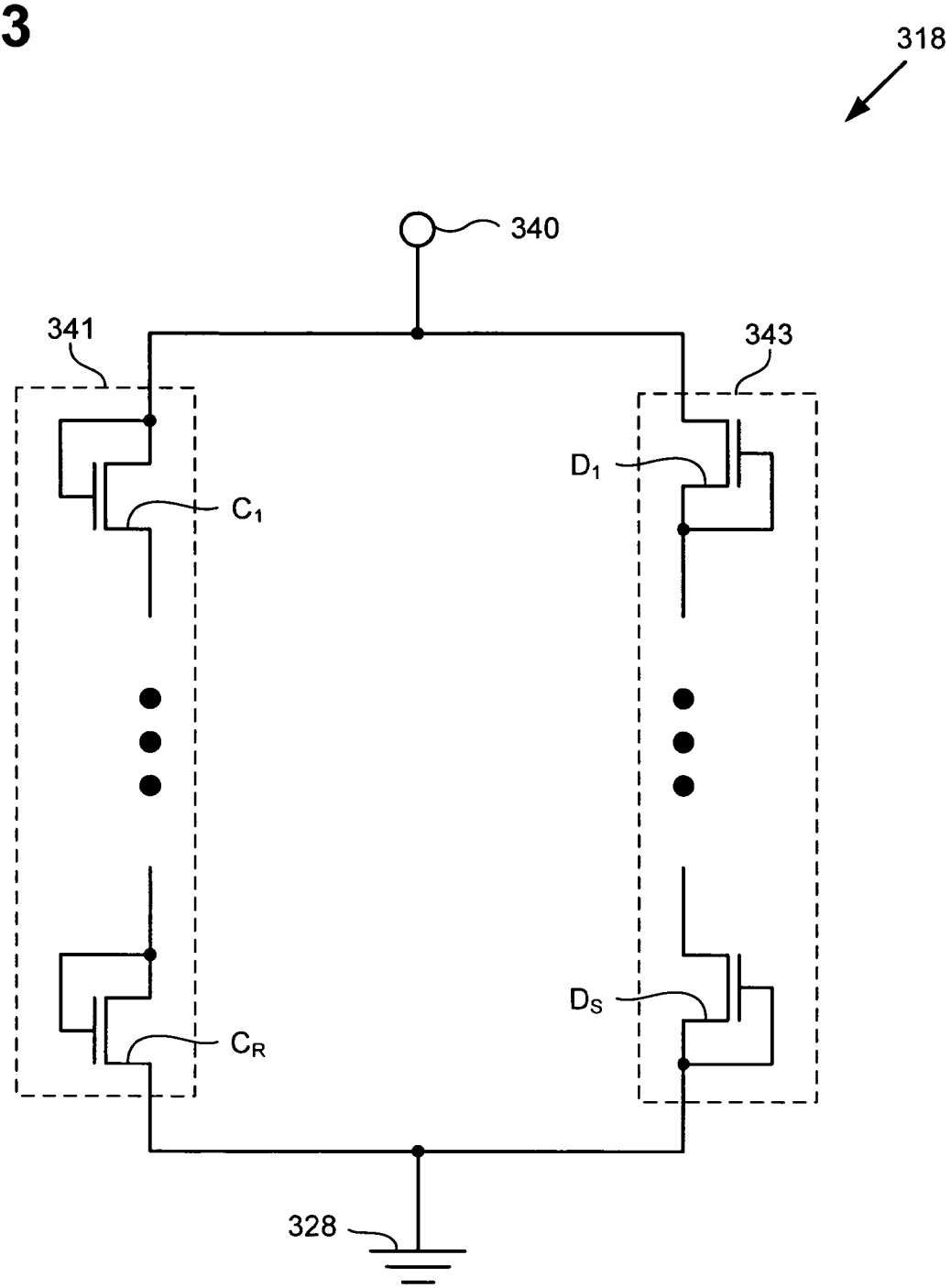
FIG. 3 illustrates a circuit diagram of an exemplary isolated port protection circuit in accordance with one embodiment of the present invention.

FIG. 3 shows a circuit diagram of an exemplary protection circuit for a balanced amplifier in accordance with one embodiment of the present invention. In FIG. 3, protection circuit 318, ground 328, and isolated port 340 correspond, respectively, to protection circuit 118, ground 128, and isolated port 140 in FIG. 1. Protection circuit 318 includes positive voltage clamp 341 and negative voltage clamp 343, which are coupled in a parallel configuration between isolated port 340 and ground 328. Positive voltage clamp 341 includes transistors $C_1, \ldots, C_R$ (hereinafter "transistors $C_1$ through $C_R$") and negative voltage clamp 343 includes transistors $D_1, \ldots, D_S$ (hereinafter "transistors $D_1$ through $D_S$").

As shown in FIG. 3, transistors $C_1$ through $C_R$ are coupled together in series between isolated port 340 and ground 228, where "R" represents the number of series-coupled transistors in positive voltage clamp 341. In the present embodiment, transistors $C_1$ through $C_R$ can each be an N channel field effect transistor (NFET), where the gate and drain of each NFET is shorted together in a configuration known in the art. In another embodiment, transistors $C_1$ through $C_R$ can each be a P channel FET (PFET). Also shown in FIG. 3, the drain and gate of the first series-coupled transistor (i.e. transistor $C_1$) is coupled to isolated port 340 and the source of the last series-coupled transistor (i.e. transistor $C_R$) is coupled to ground 328. The number of series-coupled transistors in positive voltage clamp 341 can be selected to set a desired clamping level of the positive cycle of the RF voltage at isolated port 340. If the clamping level is met or exceeded at isolated port 340, the gate-to-source voltage of each transistor will exceed a threshold voltage, causing each transistor to turn on, thereby causing power to be shunted to ground 228 via transistors $C_1$ through $C_R$. Since positive voltage clamp 341 clamps the amplitude of the positive cycle of the RF voltage at isolated port 340, the clamping level of positive voltage clamp 341 has a positive voltage value.

Further shown in FIG. 3, transistors $D_1$ through $D_S$ are coupled together in series between isolated port 340 and ground 228, where "S" represents the number of series-coupled transistors in negative voltage clamp 343. In the present embodiment, transistors $D_1$ through $D_S$ can each be an NFET, where the gate and drain of each NFET is shorted together in a similar manner as transistors $C_1$ through $C_R$. In another embodiment, transistors $D_1$ through $D_S$ can each be a PFET. Also shown in FIG. 3, the source of the first series-coupled transistor (i.e. transistor $D_1$) is coupled to isolated port 340 and the gate and drain of the last series-coupled transistor (i.e. transistor $D_S$) are coupled to ground 328. The number of series-coupled transistors in negative voltage clamp 343 can be selected to set a desired clamping level of the negative cycle of the RF voltage at isolated port 340. If the clamping level is met or exceeded at isolated port 340, the gate-to-source voltage of each transistor will exceed a threshold voltage, causing each transistor to turn on, thereby causing power to be shunted to ground 228 via transistors $D_1$ through $D_S$. Since negative voltage clamp 343 clamps the amplitude of the negative cycle of the RF voltage at isolated port 340, the clamping level of negative voltage clamp 343 has a negative voltage value. The number of transistors in negative voltage clamp 343 can be the same as the number of transistors in positive voltage clamp 341.

Thus, by using series-coupled transistors $C_1$ through $C_R$ and series-coupled transistors $D_1$ through $D_S$ to clamp the voltage levels of the respective positive and negative cycles of the RF voltage at isolated port 240, protection circuit 318 can effectively protect impedance termination 116 in balanced amplifier 102 from damage during an occurrence of a large impedance mismatch between load 104 and the balanced amplifier.

Figure 4:
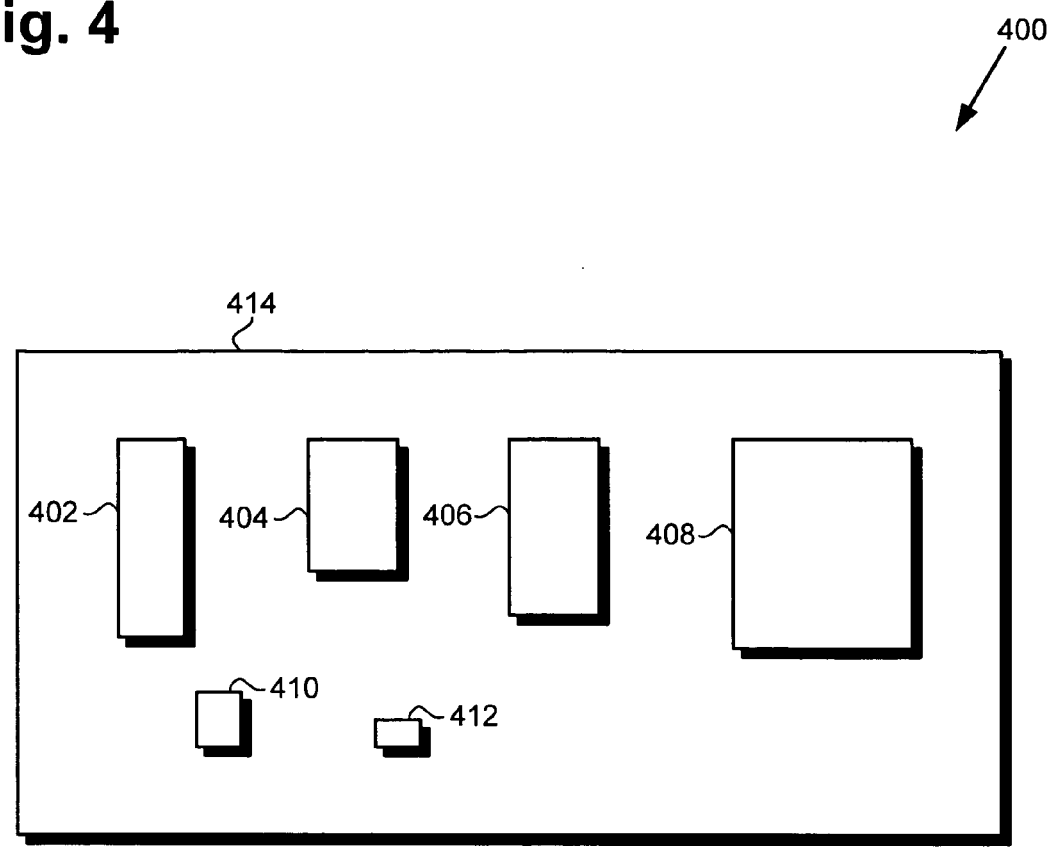
FIG. 4 illustrates a diagram of an exemplary electronic system utilizing an embodiment of the present invention.

FIG. 4 illustrates a diagram of an exemplary electronic system including an exemplary chip or die in accordance with one embodiment of the present invention. Electronic system 400 includes exemplary modules 402, 404, and 406, IC chip or semiconductor die 408, discrete components 410 and 412, residing in and interconnected through circuit board 414. In one embodiment, electronic system 400 may include more than one circuit board. IC chip 408 can comprise an embodiment of the invention's balanced amplifier, such as balanced amplifier 102 in FIG. 1, including an isolated port protection circuit, such as isolated port protection circuit 118, as described above. In one embodiment, the present invention's balanced amplifier, such as balanced amplifier 102, can be fabricated on more than one semiconductor die. Thus, IC chip 408 can also represent multiple semiconductor dies, where the multiple semiconductor dies include an embodiment of the invention's balanced amplifier, such as balanced amplifier 102.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is surface mounted on circuit board 414 and comprises a semiconductor die (or multiple semiconductor dies) including an embodiment of the invention's balanced amplifier including an isolated port protection circuit, such as protection circuit 118. In one embodiment, IC chip 408 may be mounted on a substrate in a semiconductor package, which can be in turn mounted on circuit board 414. In another embodiment, IC chip 408 may not be mounted on circuit board 414, and may be interconnected with other modules on different circuit boards. Further shown in FIG. 4, discrete components 410 and 412 are mounted on circuit board 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired or wireless communications device, a cell phone, a switching device, a router, a repeater, a codec, a wired or wireless LAN, a WLAN, a Bluetooth enabled device, a satellite set top box, a cable modem, a printer, a copier, an RF transceiver, a personal digital assistant (PDA), or in any other kind of system, device, component or module utilized in modern electronics applications.

Thus, as discussed above, by providing a protection circuit between the isolated port of an output coupler and ground, the invention provides a balanced amplifier that can advantageously utilize a small-size resistor as an impedance termination at the isolated port of the output coupler while protecting the small-size resistor from damage from a large impedance mismatch that may occur between the balanced amplifier and a load coupled to it (i.e. the balanced amplifier), such as an antenna.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A balanced amplifier comprising:
   an in-phase amplifier coupled to a first input port of an output coupler and a quadrature amplifier coupled to a second input port of said output coupler;
   an impedance termination coupled to an isolated port of said output coupler;
   a protection circuit comprising a voltage clamp coupled to said isolated port of said output coupler and configured to limit an amount of power applied across said impedance termination, the voltage clamp comprising a group of one or more electronic devices having a threshold voltage, wherein when a voltage at said isolated port of said output coupler exceeds the threshold voltage the group of one or more electronic devices shunts a current through the devices to ground.

2. The balanced amplifier of claim 1 further comprising an input coupler having a first output port coupled to an input of said in-phase amplifier and a second output port coupled to an input of said quadrature amplifier.

3. The balanced amplifier of claim 1, wherein said voltage clamp comprises a first group of series-coupled diodes coupled in parallel with a second group of series-coupled diodes.

4. The balanced amplifier of claim 1, wherein said voltage clamp comprises a first group of series-coupled FETs coupled in parallel with a second group of series-coupled FETs, wherein each of said series-coupled FETs in said first and second groups have a gate shorted to a drain.

5. The balanced amplifier of claim 2, wherein said input and said output couplers each comprise a quadrature coupler.

6. The balanced amplifier of claim 5, wherein each of said input and said output couplers is a quadrature coupler selected from the group consisting of a branchline quadrature coupler and a Lange quadrature coupler.

7. The balanced amplifier of claim 4, wherein each of said series-coupled FETs in said first and second groups comprise an NFET.

8. The balanced amplifier of claim 1, wherein an output port of said output coupler provides an RF output signal of said balanced amplifier.

9. The balanced amplifier of claim 2, wherein said input coupler has an input port for receiving an RF input signal of said balanced amplifier.

10. A semiconductor die comprising a balanced amplifier, said balanced amplifier comprising:
    an in-phase amplifier coupled to a first input port of an output coupler and a quadrature amplifier coupled to a second input port of said output coupler;
    an impedance termination coupled to an isolated port of said output coupler;
    a protection circuit comprising a voltage clamp coupled to said isolated port of said output coupler and configured to limit an amount of power applied across said impedance termination, the voltage clamp comprising a group of one or more electronic devices having a threshold voltage, wherein when a voltage at said isolated port of said output coupler exceeds the threshold voltage the group of one or more electronic devices shunts a current through the devices to ground.

11. The semiconductor die of claim 10, wherein said balanced amplifier further comprises an input coupler having a first output port coupled to an input of said in-phase amplifier and a second output port coupled to an input of said quadrature amplifier.

12. The semiconductor die of claim 10, wherein said voltage clamp comprises a first group of series-coupled diodes coupled in parallel with a second group of series-coupled diodes.

13. The semiconductor die of claim 10, wherein said voltage clamp comprises a first group of series-coupled FETs coupled in parallel with a second group of series-coupled FETs, wherein each of said series-coupled FETs in said first and second groups have a gate shorted to a drain.

14. The semiconductor die of claim 11, wherein said input and said output couplers each comprise a quadrature coupler.

15. The semiconductor die of claim 14, wherein each of said input and output couplers is a quadrature coupler selected from the group consisting of a branchline quadrature coupler and a Lange quadrature coupler.

16. The semiconductor die of claim 10, wherein an output port of said output coupler provides an RF output signal of said balanced amplifier.

17. The semiconductor die of claim 11, wherein said input coupler has an input port for receiving an RF input signal for said balanced amplifier.

18. The semiconductor die of claim 10, wherein said semiconductor die is utilized in an electronic system selected from the group consisting of a wired or wireless communications device, a cell phone, a switching device, a router, a repeater, a codec, a wired or wireless LAN, a WLAN, a Bluetooth enabled device, a satellite set top box, a cable modem, a printer, a copier, an RF transceiver, and a personal digital assistant (PDA).

* * * * *